United States Patent
Krall et al.

(10) Patent No.: US 9,093,658 B2
(45) Date of Patent: Jul. 28, 2015

(54) PRE-STRESSED FLEXIBLE OLED

(71) Applicant: Universal Display Corporation, Ewing, NJ (US)

(72) Inventors: Emory Krall, Philadelphia, PA (US); Ruiqing Ma, Morristown, NJ (US); Michael Hack, Princeton, NJ (US)

(73) Assignee: UNIVERSAL DISPLAY CORPORATION, Ewing, NJ (US)

(*) Notice: Subject to any disclaimer, the term of this patent is extended or adjusted under 35 U.S.C. 154(b) by 49 days.

(21) Appl. No.: 13/912,965

(22) Filed: Jun. 7, 2013

(65) Prior Publication Data

US 2014/0361251 A1  Dec. 11, 2014

(51) Int. Cl.
*H01L 29/08* (2006.01)
*H01L 51/52* (2006.01)

(52) U.S. Cl.
CPC ......... *H01L 51/52* (2013.01); *H01L 2251/5361* (2013.01)

(58) Field of Classification Search
CPC ............... H01L 2251/5358; H01L 2251/5361; H01L 51/52
USPC ........... 362/249.08, 382, 418; 257/40, 59, 72; 313/498, 504, 510
See application file for complete search history.

(56) References Cited

U.S. PATENT DOCUMENTS

| | | | |
|---|---|---|---|
| 4,769,292 A | 9/1988 | Tang et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 7,279,704 B2 | 10/2007 | Walters et al. | |
| 7,431,968 B1 | 10/2008 | Shtein et al. | |
| 7,968,146 B2 | 6/2011 | Wagner et al. | |
| 2003/0230980 A1 | 12/2003 | Forrest et al. | |
| 2004/0160166 A1* | 8/2004 | Cok | 313/498 |

(Continued)

FOREIGN PATENT DOCUMENTS

| | | |
|---|---|---|
| EP | 1367675 A1 | 12/2003 |
| WO | 2008057394 | 5/2008 |
| WO | 2010011390 | 1/2010 |

OTHER PUBLICATIONS

Baldo, et al., "Highly efficient phosphorescent emission from organic electroluminescent devices", Nature, vol. 395, pp. 151-154, 1998.

(Continued)

*Primary Examiner* — Long K Tran
(74) *Attorney, Agent, or Firm* — Morris & Kamlay LLP

(57) ABSTRACT

Devices are provided that include a flexible OLED panel and a connection between points of the flexible OLED panel that causes the flexible OLED panel to be disposed in a non-planar configuration. Alternatively or in addition, the connection may be a flexible component connected to the flexible OLED panel, which is configured to maintain the flexible OLED panel in the non-planar shape.

22 Claims, 5 Drawing Sheets

(56) References Cited

U.S. PATENT DOCUMENTS

2004/0174116 A1   9/2004   Lu et al.
2012/0262929 A1*  10/2012  Knapp et al. .................. 362/382
2012/0286245 A1   11/2012  Levermore et al.
2012/0286649 A1   11/2012  Rajan et al.

OTHER PUBLICATIONS

Baldo, et al., "Very high-efficiency green organic light-emitting devices based on electrophosphorescence", Applied Physics Letters, vol. 75, No. 1, pp. 4-6, Jul. 5, 1999.

* cited by examiner

PRE-STRESSED FLEXIBLE OLED

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs). More specifically, the invention relates to flexible OLED devices that may remain or return to a non-planar shape without requiring continuous application of an external force.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine)iridium, denoted Ir(ppy)$_3$, which has the following structure:

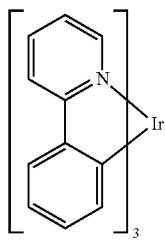

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

Devices including one or more flexible OLED panels are provided. The OLED panel or panels may be pre-stressed, such that each panel is disposed in a non-planar configuration without requiring application of an external force.

In an embodiment, a device includes a flexible OLED panel and a connection between a first point of the flexible OLED panel and a second point of the flexible OLED panel, which causes the flexible OLED panel to be disposed in a first non-planar shape. The connection also may be a flexible component connected to the flexible OLED panel, which is arranged and configured to maintain the flexible OLED panel in the non-planar shape. The connection may allow the flexible OLED panel to be deformed to a second non-planar shape by application of an external force, and may cause the OLED to remain disposed in the second non-planar shape subsequent to removal of the external force. Alternatively, the connection may cause the flexible OLED panel to return to the first non-planar shape after removal of the external force. The connection may cause the first point to be in direct physical contact or in indirect physical contact with the second point. The connection may be adjustable to change the distance between the first point and the second point. The connection may include various physical attachment mechanisms, such as a lamination between a first planar component of the flexible OLED panel and a second planar component of the flexible OLED panel, a mechanical connection between a first edge of the flexible OLED panel and a second edge of the flexible OLED panel, or the like. The device may include an electrical connection sufficient to allow the device to be operable as a luminaire, or to connect to a lighting fixture to form a luminaire. The flexible OLED panel may be rectangular, semi-circular, in the shape of a circle sector, or any other desired shape, such that the connection causes the flexible OLED panel to assume a cylindrical, conical, or other non-planar shape, respectively. The connection may be formed by one or more flexible panels, rigid components, flexible or non-flexible OLED panels, or the like. The OLED panel may have various other characteristics and attributes, such as being color-tunable, touch sensitive, and/or transparent.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
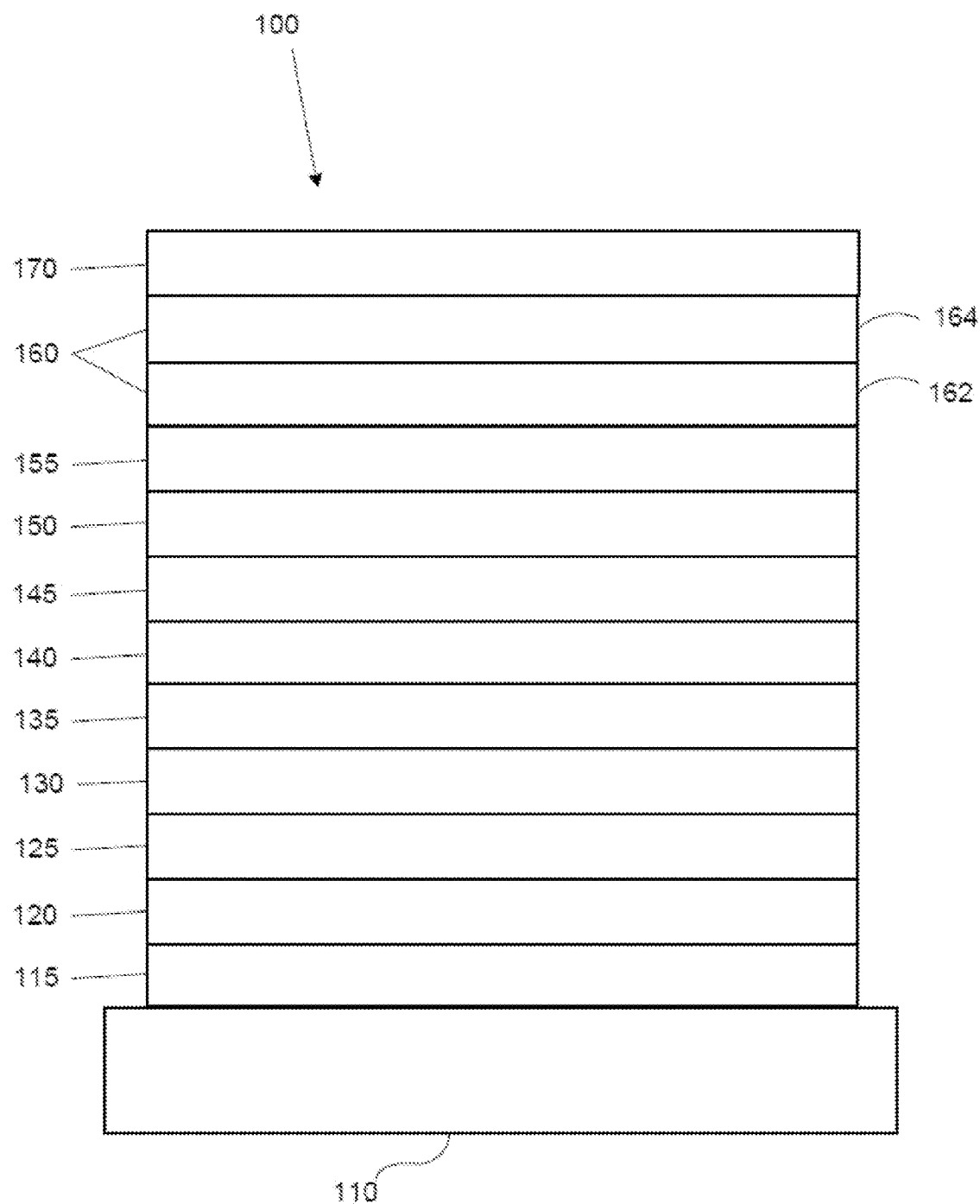
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
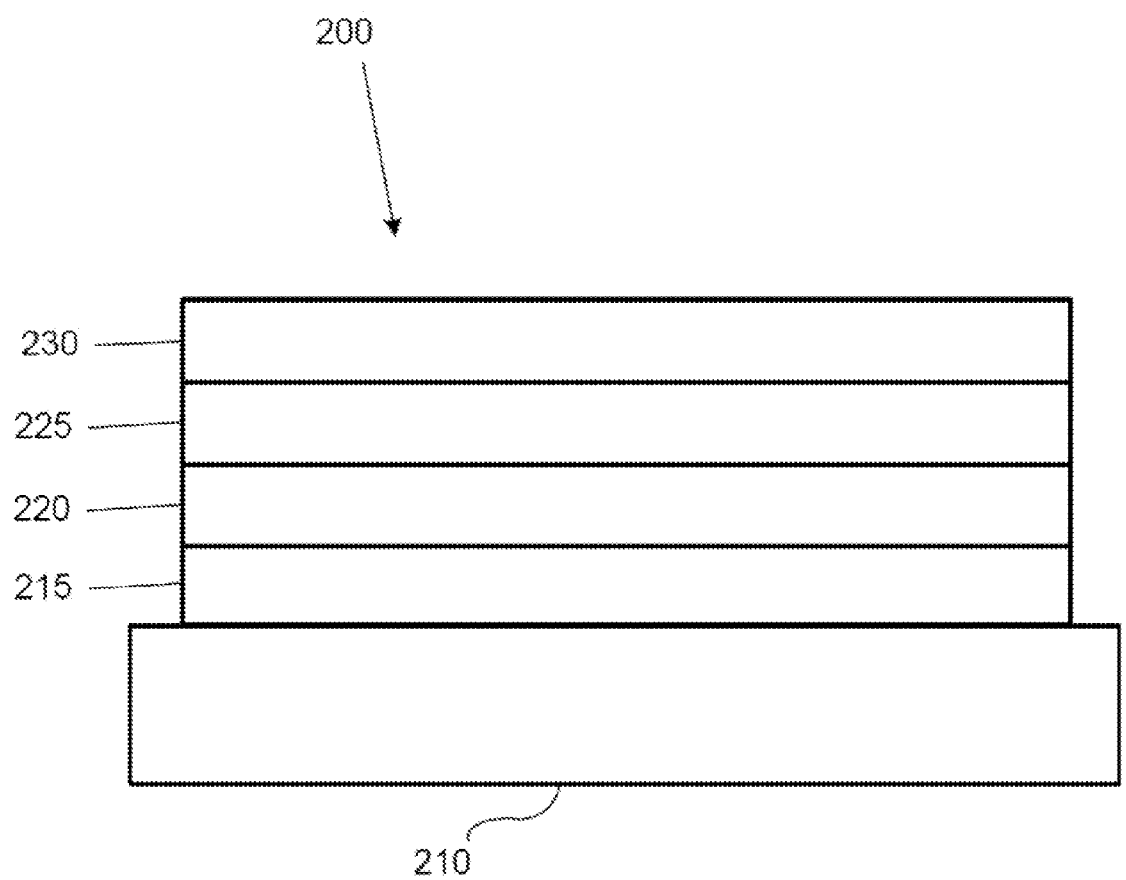
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution proccessability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, aralkyl, heterocyclic group, aryl, aromatic group, and heteroaryl are known to the art, and are defined in U.S. Pat. No. 7,279,704 at cols. 31-32, which are incorporated herein by reference.

As previously described, one use of OLED emissive devices is as flexible lighting and/or display panels. Specifically, flexible OLED lighting panels can be placed into different shapes than conventional non-flexible panels, such as to form attractive and simple luminaires. It may be desirable that each panel in a luminaire is self-supporting, and only require connectivity to a neighboring panel. As disclosed herein, such luminaires may include a single self-supporting OLED panel, an array of self-supporting OLED panels, or one or more self-supporting OLED panels attached to a fixture.

Flexible OLED panels typically deform under their own weight. By intentionally adding a strain to a flexible OLED panel, the panel may be made to take a non-planar three-dimensional shape and become structural. That is, the OLED panel may be able to support itself and/or maintain a non-planar shape without being placed in an external fixture or otherwise requiring a continuous application of external force. The OLED panel may not become completely rigid, so that it will still deform when a certain amount of external force is applied, will return to the original pre-stressed shape when the external force is removed. For example, an OLED panel may be combined with a connector, such as a rigid or flexible rod, which holds the OLED panel into a non-planar shape such as a curved shape. An external force applied to the OLED panel may cause it to assume a different non-planar shape, such as where it is curved more tightly, curved in a direction perpendicular to the first curve, or the like. Upon removal of the external force, the OLED panel may return to the original non-planar shape. As disclosed in further detail herein, various other shapes, configurations, and components may be used.

Embodiments disclosed herein may allow for potentially cheaper, simpler, more lightweight, and/or more minimal OLED lighting products which may be capable of changing shapes. Conventional techniques for creating non-planar configurations of an OLED panel typically require application of an external force, which requires additional components to create the force. For example, a luminaire that includes a flexible OLED panel may include a rigid fixture, into which the OLED panel may be fitted, and which is sufficiently rigid to maintain the OLED in the non-planar shape. In some cases it may be possible to create non-planar forms by permanently deforming (molding) the OLED panel, but such processes would likely involve so much heat or pressure that the OLED itself would be destroyed.

Generally, a device according to an embodiment of the invention may include a flexible OLED panel, and a connection between points of the flexible OLED panel that causes the flexible OLED panel to be disposed in a non-planar configuration. Alternatively or in addition, the connection may be a flexible component connected to the flexible OLED panel, which is configured to maintain the flexible OLED panel in the non-planar shape.

Figure 3:
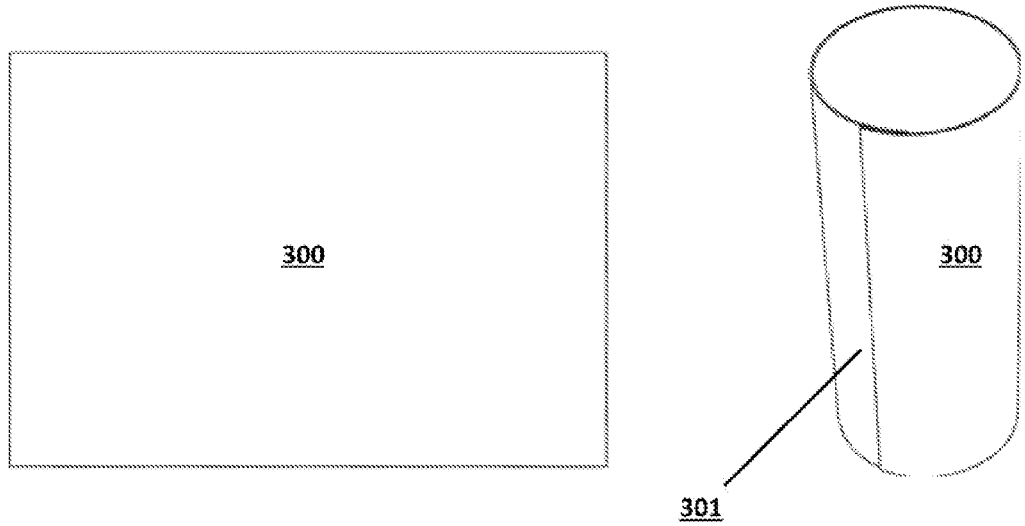
FIG. 3 shows a rectangular OLED panel before and after being rolled and mechanically connected to itself to create a tubular form according to an embodiment of the invention.

FIG. 3 shows an example OLED panel before and after being disposed in a non-planar shape according to an embodiment of the invention. The OLED panel 300 may be rectangular. If placed on a planar surface, i.e., if viewed such that the panel 300 is in the plane of the page in FIG. 3, the OLED may be essentially planar. If placed on an edge, i.e., perpendicular to the plane of the page in FIG. 3, an OLED panel typically would not support its own weight. However, according to an embodiment of the invention, a connection 301 may be made between multiple points on the OLED panel, which holds the panel in a non-planar shape. In the example shown in FIG. 3, the connection 301 may be made, for example, by attaching an edge of the OLED panel to another portion of the panel, thus causing the OLED panel 300 to remain in a tubular non-planar configuration as shown. As described in further detail herein, other non-planar shapes and configurations also may be achieved using embodiments of the invention.

Figure 4:
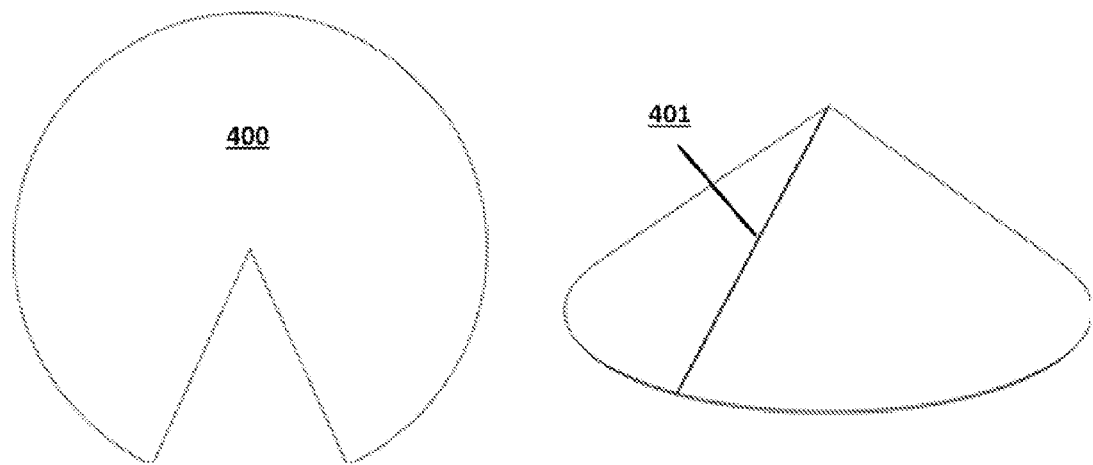
FIG. 4 shows a round OLED panel with a pie-piece shaped void, before and after being mechanically connected to itself to create a conic form according to an embodiment of the invention.

FIG. 4 shows a device according to an embodiment of the invention in which a semi-circular or circle sector-shaped OLED panel 400 may be formed into a conical non-planar shape by the connection 401. As with the example shown in FIG. 3, the connection may include, for example, an attachment of one edge of the OLED panel to another edge or point of the panel.

Figure 5:
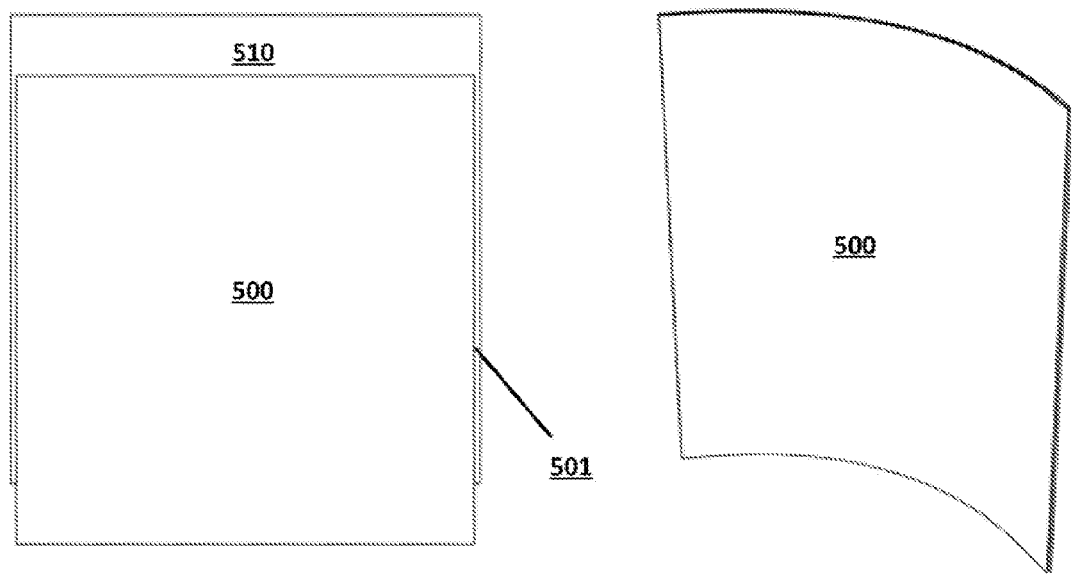
FIG. 5 shows a rectangular OLED panel and a diffuser sheet, before and after being laminated together to create a curved form according to an embodiment of the invention.

FIG. 5 shows an example device according to an embodiment of the invention including a rectangular OLED panel 500 and a diffuser sheet 510, before and after being laminated together. The diffuser sheet 510 may connect to multiple points of the OLED panel. By using a diffuser sheet having different dimensions than the OLED panel and attaching the panels as shown, the diffuser sheet may create a curved form. The panels may be attached via one or more connections 501, for example by laminating or otherwise connecting various parts of the panels together to form the curved non-planar shape.

Figure 6:
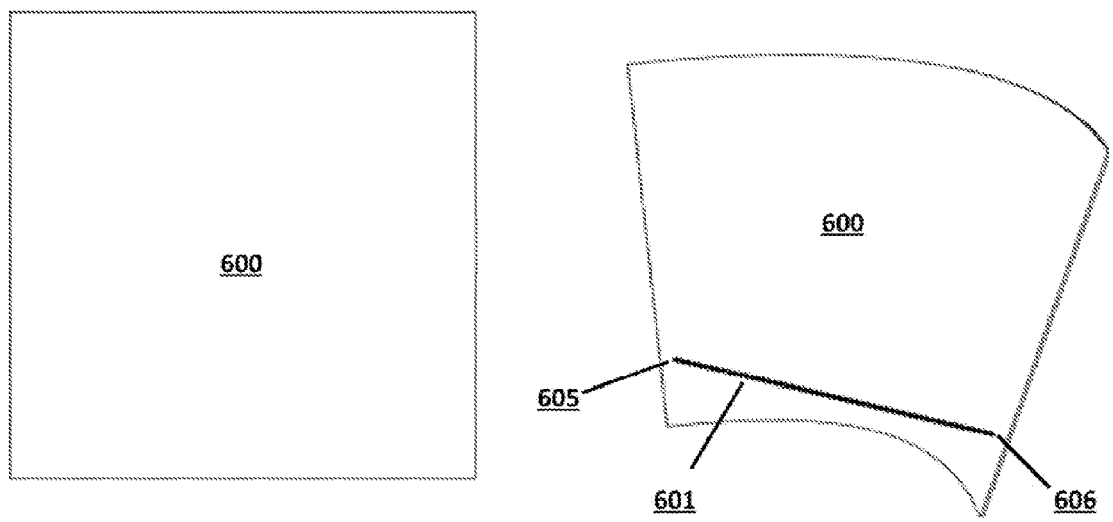
FIG. 6 shows a rectangular OLED before and after being pulled into a curved form by a connector according to an embodiment of the invention.

FIG. 6 shows an example device according to an embodiment of the invention, including a rectangular OLED 600 before and after being disposed in a curved form by a connector 601. The connector 601 may be, for example, a wire, string, rigid rod, or the like, which connects two points of the OLED 605, 606 to one another.

Figure 7:
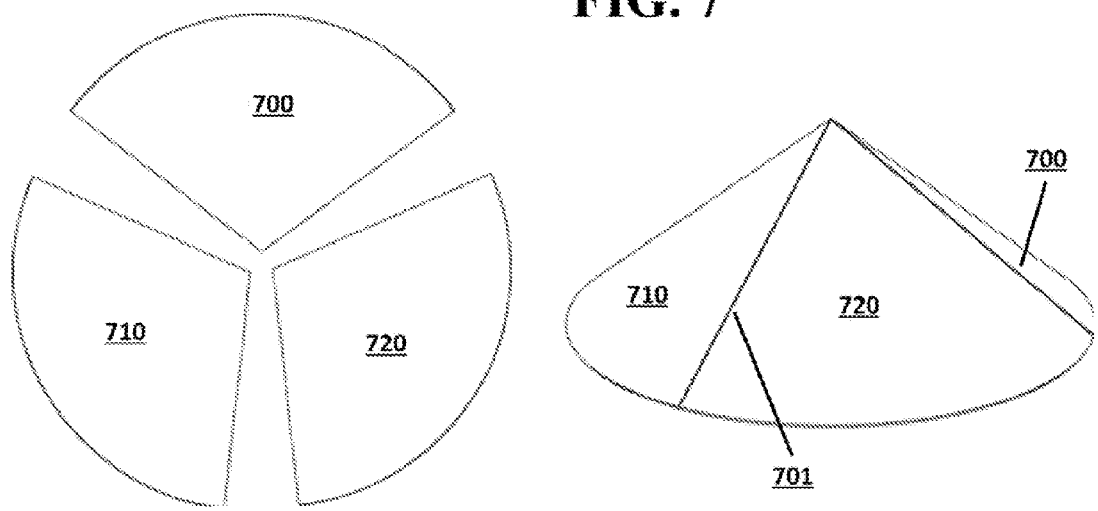
FIG. 7 shows several circular sector panels before and after being mechanically connected together to create a conic form according to an embodiment of the invention.

FIG. 7 shows an example device according to an embodiment of the invention, including several circular sector panels before and after being mechanically connected together to create a conic form. Each of the panels 700, 710, 720 may be an OLED panel, or it may be a non-emissive panel. Using different combinations of OLED panels and/or non-emissive panels, different emissive profiles may be achieved. For example, each OLED panel may be separately controllable to allow for different arrangements of colors emitted by different sides of the device. Similarly, where non-emissive panels are used, the device may emit light in a limited direction. Adjacent panels may be attached to one another by connections 701, such as by connecting adjacent edges of the panels. Similarly, one panel 710 may serve as a connection between two OLED panels 700, 720, for example where one of the panels is not a flexible panel, but rather has a rigid semi-conical shape.

Figure 8:
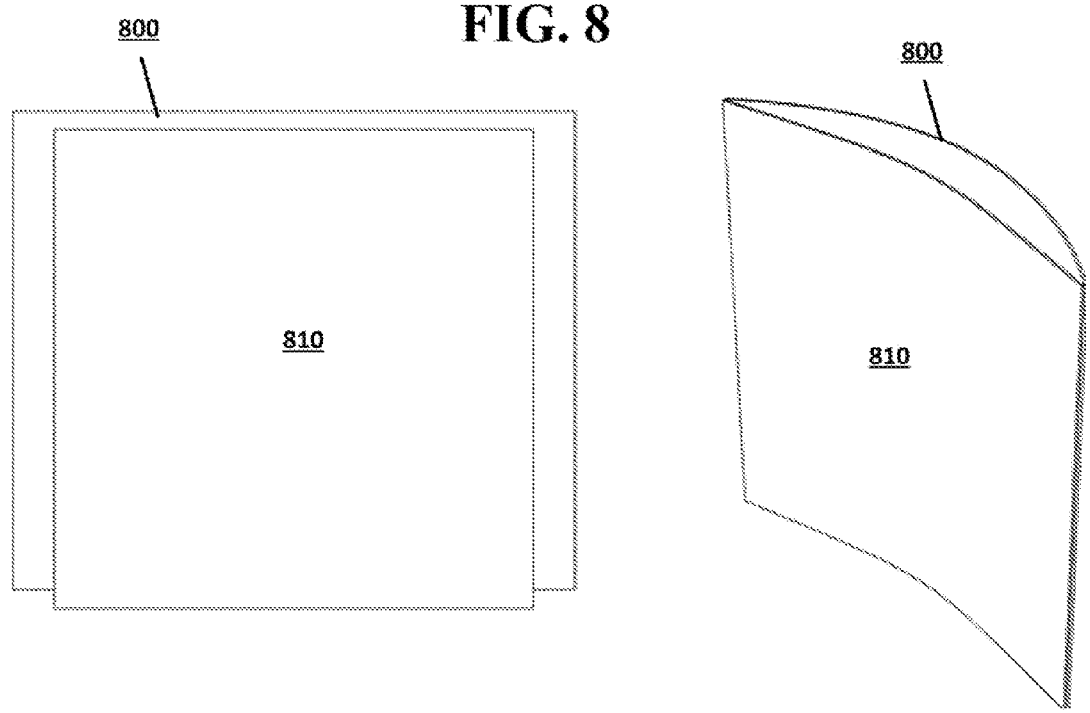
FIG. 8 shows an OLED panel and a second panel before and after being mechanically connected together to create a curved form with a gap between the panels according to an embodiment of the invention.

FIG. 8 shows an example device according to an embodiment of the invention, which includes an OLED panel 810 and a second panel 820, before and after being mechanically connected together to create a curved form with a gap between the panels. As with the panels in FIG. 7, the second panel 820 may be an OLED or a non-emissive panel, and may be flexible or rigid. The edges of the panels may be connected, such as to place the OLED panel 800 in a curved non-planar shape as shown.

In some configurations, the connection between different points of a flexible OLED panel also may allow the flexible OLED to be deformed to other non-planar shapes by application of an external force. For example, the connections 501, 601 in FIGS. 5 and 6 may allow the OLED panel to be curved in a vertical direction, or to be further curved in the same direction as shown. As a specific example, the length of the connection 601 in FIG. 6 may be adjustable, thereby allowing the flexible OLED panel 600 to be disposed in various non-planar shapes having different curvatures. In some configurations, the connection may cause the OLED to remain disposed in the second three-dimensional shape subsequent to removal of the external force. Again referring to the connection 601 in FIG. 6, the connection may be adjustable in length by application of an external force to achieve a different curvature, and may retain the adjusted length after removal of the external force. For example, the adjustable connection 601 may have sufficient friction to resist the force exerted by the OLED panel which would normally cause the OLED panel to return to a planar shape or to the curved non-planar shape shown in FIG. 6. An external force may be used to overcome such friction, allowing for the device to be placed into additional non-planar shapes.

In some configurations, a connection may the first point to be in direct physical contact with the second point. For example, the connections 301, 401 cause portions of an OLED panel to be in direct physical contact. Similarly, the connections 501, 601, 701 cause portions of a single OLED panel to be in indirect physical contact, by serving as a physical intermediary between different points on the OLED panel.

In some configurations, a connection between different points of an OLED panel may include a lamination between a first planar component of the flexible OLED panel and a second planar component of the flexible OLED panel. For example, the OLED panels 300, 400 may be disposed in a non-planar shape by laminating portions of each panel to another portion of the same panel, such that the panel overlaps itself at the connection 301, 401, respectively. Similarly, in FIG. 7 the panels 710, 720, 730 may be connected to one another by connecting adjacent edges together, or the panels may overlap and be laminated to one another.

Devices described herein, such as those illustrated in FIGS. 3-8, also may include an electrical connection sufficient to allow the device to be connected to a lighting fixture to form a luminaire or similar device. Thus, luminaires and other devices having flexible OLED lighting panels may be achieved, without requiring a user to form the flexible OLED panel into the desired shape. As a specific example, a luminaire having a cylindrical or tubular emissive component as shown in FIG. 3, a conical component as shown in FIGS. 4 and 7, or a curved emissive component as shown in FIGS. 5, 6, and 8 may be provided to a user, who can then mount the emissive component in an existing fixture. The resulting luminaire thus has an emissive component of the desired shape without the user having to bend a planar OLED panel into the desired shape.

The devices described herein may not need any lighting fixture to provide the mechanical support. For example, the non-planar OLED device in FIG. 3 can be placed on a table surface. An electrical wire connected to the device can provide power and also control information, such as brightness or color, if the panel is color tunable. The power and control information can also be provided wirelessly.

Devices as disclosed herein may use flexible OLED panels of any type disclosed herein, including color-tunable panels, touch sensitive panels, and/or transparent panels. Thus, devices having different aesthetic appearances and/or additional functionality, such as touch controls, may be achieved.

In general, a flexible OLED panel may be pre-stressed as disclosed herein in a variety of ways. For example, different areas of a single OLED panel together may be mechanically connected together. As a specific example, a square flexible panel may be rolled into a tube with overlapping edges adhered or laminated into place, as shown in FIG. 3. As another example, a round panel may have a portion removed or omitted, and the edges of the resulting gap fastened together to form a cone as shown in FIG. 4. In another technique, two or more planar components, such as a diffuser sheet and a substrate, may be laminated together, where one component is shorter than the other. When the edges are aligned, stress is created within the inter-laminar layer that will cause the OLED panel to permanently curve. Such a technique may be used, for example, to achieve the non-planar shapes shown in FIG. 5. Stress also may be created by introducing additional elements into the construction of the OLED panel, such as wires, strings, rods, or the like, that are attached to the panel in at least two positions and pull at least two edges of a panel toward each other, as shown in FIG. 6.

In many cases, a rigid component may not be needed to form the non-planar shape. For example, a flexible wire connected to a flexible OLED panel can form non-planar shape, such as the configuration shown in FIG. 6. Similarly, two flexible panels may be used to form a non-planar shape, for example as shown in FIG. 8, without requiring any additional non-flexible component.

One or more OLED panels also may be pre-stressed when connected into an array. For example, two or more circle sector panels may be connected with straight edges fastened together to place the panels in a conical shape, for example as shown in FIG. 7. As another example, two rectangular panels of different dimensions may be fastened together at two opposing edges, to form a curve with a gap between the panels, for example as shown in FIG. 8.

It will be understood that various configurations other than the specific examples disclosed herein may be used to pre-stress a flexible OLED panel without departing from the scope of the invention. It is also understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A device comprising:
   a flexible OLED panel; and
   a connection between a first point of the flexible OLED panel and a second point of the flexible OLED panel, the connection causing the flexible OLED panel to be disposed in a first non-planar shape, allowing the flexible OLED panel to be deformed to a second non-planar shape by an external force, and, upon removal of the external force, either causing the flexible OLED to remain in the second non-planar shape, or causing the flexible OLED panel to return to the first non-planar shape.

2. The device of claim 1, wherein the connection causes the first point to be in direct physical contact with the second point.

3. The device of claim 1, wherein the connection causes the first point to be in indirect physical contact with the second point.

4. The device of claim 3, wherein the connection is adjustable to change the distance between the first point and the second point.

5. The device of claim 1, wherein the connection comprises a lamination between a first planar component of the flexible OLED panel and a second planar component of the flexible OLED panel.

6. The device of claim 1, wherein the connection mechanically connects a first edge of the flexile OLED panel with a second edge of the flexible OLED panel.

7. The device of claim 1, further comprising an electrical connection.

8. The device of claim 7, wherein the device is operable as a luminaire.

9. The device of claim 1, further comprising a connector configured to connect the device to a lighting fixture.

10. The device of claim 1, wherein the device is operable as a luminaire.

11. The device of claim 1, wherein the flexible OLED panel is rectangular.

12. The device of claim 11, wherein the connection causes the flexible OLED panel to be disposed in a cylindrical shape.

13. The device of claim 1, wherein the flexible OLED panel is in the shape of a circle sector.

14. The device of claim 13, wherein the connection causes the flexible OLED panel to be disposed in a conical shape.

15. The device of claim 1, wherein the connection comprises a second flexible panel.

16. The device of claim 15, wherein the second flexible panel comprises an OLED panel.

17. The device of claim 15, wherein the second flexible OLED panel is connected to the first point of the first flexible OLED panel.

18. The device of claim 17, further comprising a third flexible OLED panel connected to the second flexible OLED panel and the second point of the first flexible OLED panel.

19. The device of claim 1, wherein the flexible OLED panel is color-tunable.

20. The device of claim 1, wherein the flexible OLED panel is touch sensitive.

21. The device of claim 1, wherein the flexible OLED panel is transparent.

22. The device of claim 1, wherein the connection comprises a flexible component connected to the flexible OLED panel, said flexible component arranged and configured to maintain the flexible OLED panel in a non-planar shape.

* * * * *